United States Patent
Johal et al.

(10) Patent No.: US 7,871,830 B2
(45) Date of Patent: Jan. 18, 2011

(54) END POINT DETECTION METHOD FOR PLASMA ETCHING OF SEMICONDUCTOR WAFERS WITH LOW EXPOSED AREA

(75) Inventors: Sumer S. Johal, Walnut Creek, CA (US); Barton Lane, Pleasanton, CA (US); Georges J. Gorin, Novato, CA (US); Sylvia G. J. P. Spruytte, Palo Alto, CA (US); Herve C. Kieffel, San Francisco, CA (US)

(73) Assignee: Pivotal Systems Corporation, Pleasanton, CA (US)

( * ) Notice: Subject to any disclaimer, the term of this patent is extended or adjusted under 35 U.S.C. 154(b) by 695 days.

(21) Appl. No.: 11/335,099

(22) Filed: Jan. 18, 2006

(65) Prior Publication Data

US 2006/0157446 A1    Jul. 20, 2006

Related U.S. Application Data

(60) Provisional application No. 60/644,928, filed on Jan. 19, 2005.

(51) Int. Cl.
*H01L 21/302* (2006.01)

(52) U.S. Cl. .............................. 438/10; 438/9; 438/689; 216/59; 216/61; 427/8; 427/569

(58) Field of Classification Search .................. 438/9, 438/689, 706, 714; 216/67, 83, 86
See application file for complete search history.

(56) References Cited

U.S. PATENT DOCUMENTS

| | | | |
|---|---|---|---|
| 4,954,212 A | 9/1990 | Gabriel et al. | |
| 5,198,072 A | 3/1993 | Gabriel | |
| 5,501,766 A | 3/1996 | Barbee et al. | |
| 5,653,894 A | 8/1997 | Ibbotson et al. | |
| 5,900,161 A * | 5/1999 | Doi .............................. | 216/60 |
| 5,939,886 A * | 8/1999 | Turner et al. ................. | 324/464 |
| 6,184,687 B1 * | 2/2001 | Yamage et al. ............... | 324/464 |
| 6,274,500 B1 | 8/2001 | Xuechun et al. | |
| 6,326,794 B1 | 12/2001 | Lundquist et al. | |
| 6,447,691 B1 * | 9/2002 | Denda et al. ................... | 216/61 |
| 6,596,551 B1 | 7/2003 | Usui et al. | |
| 6,627,464 B2 | 9/2003 | Coumou | |
| 6,677,246 B2 * | 1/2004 | Scanlan et al. .............. | 438/723 |
| 6,703,250 B2 | 3/2004 | Chin | |
| 6,732,295 B2 | 5/2004 | Lee | |
| 6,745,095 B1 | 6/2004 | Ben-Dov et al. | |
| 7,402,257 B1 * | 7/2008 | Sonderman et al. ........... | 216/60 |
| 2003/0082835 A1 * | 5/2003 | McChesney et al. .......... | 438/10 |
| 2005/0084988 A1 * | 4/2005 | Huang et al. .................... | 438/9 |
| 2006/0000799 A1 * | 1/2006 | Doh et al. ...................... | 216/59 |

* cited by examiner

*Primary Examiner*—Anita K Alanko
(74) *Attorney, Agent, or Firm*—Michael W. Caldwell

(57) ABSTRACT

A method for controlling the plasma etching of semiconductor wafers determines the impedance of a plasma chamber using values representing voltage, current, and the phase angle between them, as provided by a sensor. All or less than all of the data during a first time period may be used to calculate a model. During a second time period, real time data is used to calculate a version of the instant impedance of the chamber. This version of impenence is compared to a time-projected version of the model. The method determines that etching should be stopped when the received data deviates from the extrapolated model by a certain amount. In some embodiments a rolling average is used in the second time period, the rolling average compared to the model to determine the end point condition.

10 Claims, 5 Drawing Sheets

US 7,871,830 B2

END POINT DETECTION METHOD FOR PLASMA ETCHING OF SEMICONDUCTOR WAFERS WITH LOW EXPOSED AREA

CROSS REFERENCE TO RELATED APPLICATIONS

The present application claims priority of U.S. provisional application No. 60/644,928, filed Jan. 19, 2005. The provisional application is incorporated herein by reference in its entirety.

FIELD OF THE INVENTION

This invention relates to semiconductor processing methods. More specifically it relates to controlling the plasma etching of semiconductor wafers.

BACKGROUND OF THE INVENTION

The selective etching of semiconductor wafers by a plasma gas has been used by the semiconductor industry for many years. Much has been invested in the search for methods to control critical dimensions, as well as methods for determining when to stop etching. If etch time is over done the result can be poor control of dimensions relative to the target, missing geometries, poor performance, and the like. If etch time is too low the result can be oversized dimension of circuit elements, circuit shorts, open or highly resistive contacts, or other undesirable results. Control of the etch time is often simply a fixed time that has been determined by experimentation. The result is adequate but not optimum, especially not for a specific wafer. The relevant art includes methods for determining when to stop etching based upon various sensed parameters. This is difficult when the area being etched is small compared to the area protected by the masking material. The present invention provides a method for determining when to stop etching an instant wafer, even when the area to be etched is a small per cent of the whole surface.

SUMMARY OF THE INVENTION

In The method according to the present invention a controller operates upon certain data provided by an RF sensor. The controller includes means for storing and analyzing data, for computing certain values, for making logical decisions, and for communicating commands. In one embodiment the controller disregards a first period of data, then analyzes the data received during a second period in order to construct a model of the interaction between the plasma etching process and the wafer being etched. The model is extended for a third time period, during which the controller continues to receive the certain data and compare a version of the received data to a version of the model extended in time. When the model and the received data differ by a predetermined amount the controller issues a command which results in stopping the etching process for the instant wafer. In some embodiments, etching is stopped if the elapsed etching time has exceeded a predetermined maximum time.

DETAILED DESCRIPTION OF THE INVENTION

Figure 1:
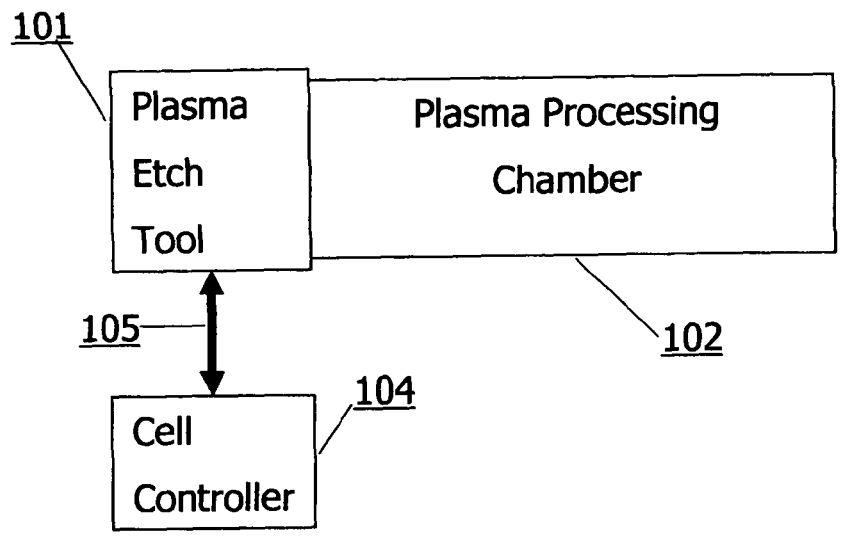
FIG. 1 shows the connections between major elements comprising a plasma etch system used for semiconductor wafer processing in the relevant art. PRIOR ART.

FIG. 1 shows the major elements comprising a representative plasma etch system used for semiconductor wafer processing by the relevant art. A plasma etch tool 101 has one or more processing chambers 102 in which individual wafers are etched. The plasma etch tool is connected with the communications means of cell controller 104 via path 105. Cell controller 104 usually includes means for storing a recipe for the process to be performed by the plasma processing chamber 102. In one configuration the recipe is downloaded to the plasma etch tool from the cell controller via path 105 when a batch of wafers is to be processed, and the plasma etch tool thereafter controls the plasma processing chamber per the recipe. The recipe comprises several actions, such as moving the wafer, closing the chamber, turning on a pump, turning on the RF generator 302, and such. The recipe includes an etch time. In another configuration the cell controller 104 maintains control of the process by sending commands at appropriate times to the plasma etch tool, which in turn controls the processing chamber, responsive to the commands from the cell controller.

Figure 2:
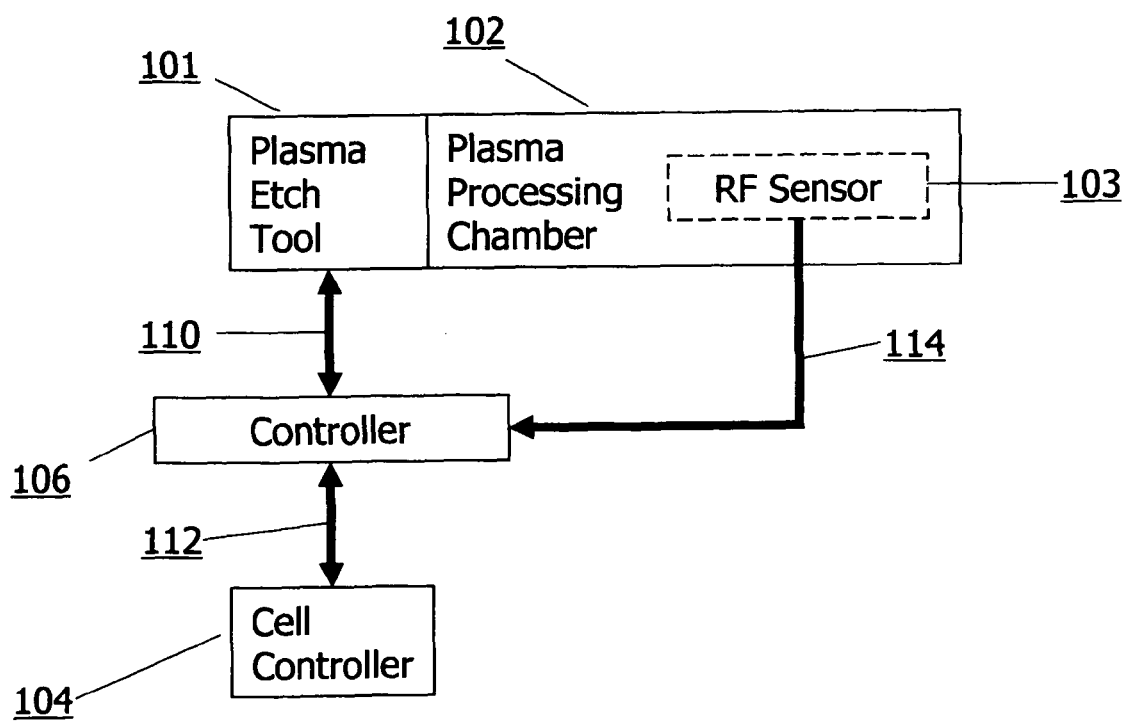
FIG. 2 shows the connections between the major elements comprising a plasma etch system according to one embodiment of the present invention.

As per FIG. 2, in one embodiment of the present invention a controller 106 is connected between the cell controller 104 and the plasma etch tool 101. Connection means 110 and 112 are any suitable communications method and media, such as RS-232, LAN, optical fiber, infra red beam, or the like. In some embodiments the plasma etch tool 101 and the cell controller 104 cannot detect the presence of controller 106; controller 106 mimics commands from cell controller 104 to plasma etch tool 101 such that the plasma etch tool considers the mimicked commands to have originated from cell controller 104.

Figure 3:
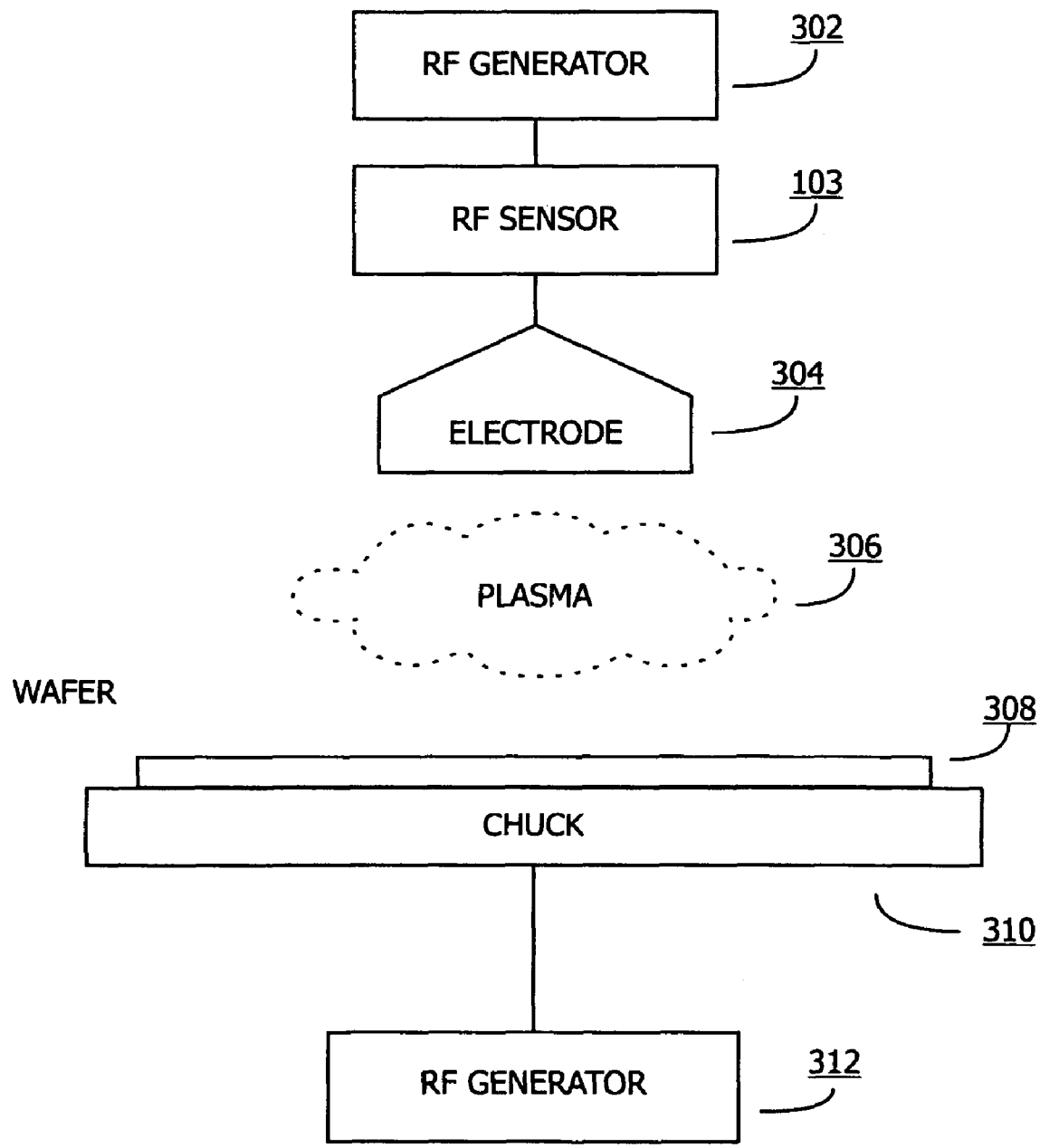
FIG. 3 shows the major elements in the interior of a plasma processing chamber in a plasma etch system.

Referring to FIG. 2 and FIG. 3, an RF sensor 103 in plasma processing chamber 102 measures certain parameters of the RF power delivered to the plasma processing chamber 102. Collectively all components shown in FIG. 3 except RF generator 302 and RF sensor 103 comprise the plasma processing chamber of FIG. 2. RF sensor 103 is connected between RF generator 302 and electrode 304. Were RF sensor 103 not present, RF generator 302 would be connected directly to electrode 304. In one embodiment RF sensor is a Z-SCAN™ sensor, available from Advanced Energy, Fort Collins, Colo.

Examples of the RF sensor 103 measurements include representations of voltage, current, and the phase angle between them at the fundamental or other frequency(s) associated with the RF generator 302. In some systems the fundamental frequency of RF generator 302 is 2 MHz. The RF sensor 103 provides sets of data for multiple frequencies, for example voltage, current, and phase data, as well as other measured or calculated values associated with the processing chamber, to controller 106 via the communications means path 114. The controller 106 includes means for communication, data and program storage, and means for executing a computer program or its equivalent. In one embodiment a computer program implements The method according to the present invention for processing the data sets received from RF sensor 103 to determine if the etch process in chamber 102 should be terminated. In another embodiment the invention is implemented in logic, such as with a gate array or FPGA or other logic means. One skilled in the art will know of many alternative embodiments which implement The method according to the invention. Means for control of the plasma system resides within the plasma etch tool 101, the plasma processing chamber 102, a system controller, or other means specific to the design of the plasma system as implemented by the semiconductor wafer processing facility.

FIG. 3 shows some components associated with a plasma processing chamber 102. An RF generator 302 drives an electrode 304, ionizing the gas inside the chamber and creating a plasma 306. The plasma etches those areas of a wafer 308 that are not protected by a photo-resist coating. The plasma also etches some of the photo-resist coating. The wafer 308 is held upon a chuck 310 that is charged by another RF generator 312, thereby charging the wafer surface. The mechanism by which a plasma etches material from a semiconductor wafer is well understood by those skilled in the art.

Figure 4A:
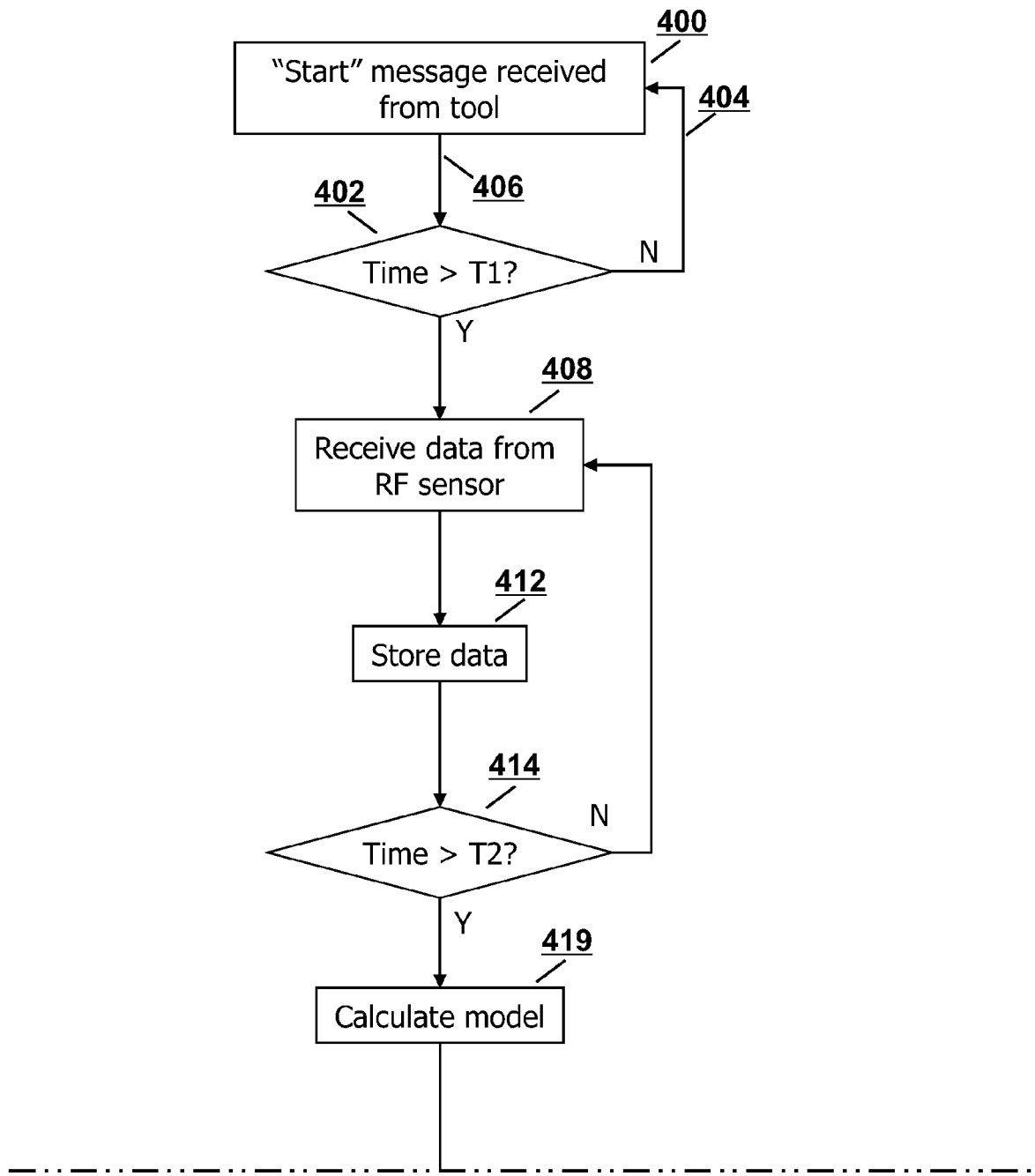
FIGS. 4A and 4B is a flow chart of the logic of one embodiment of the present invention.
Figure 4B:
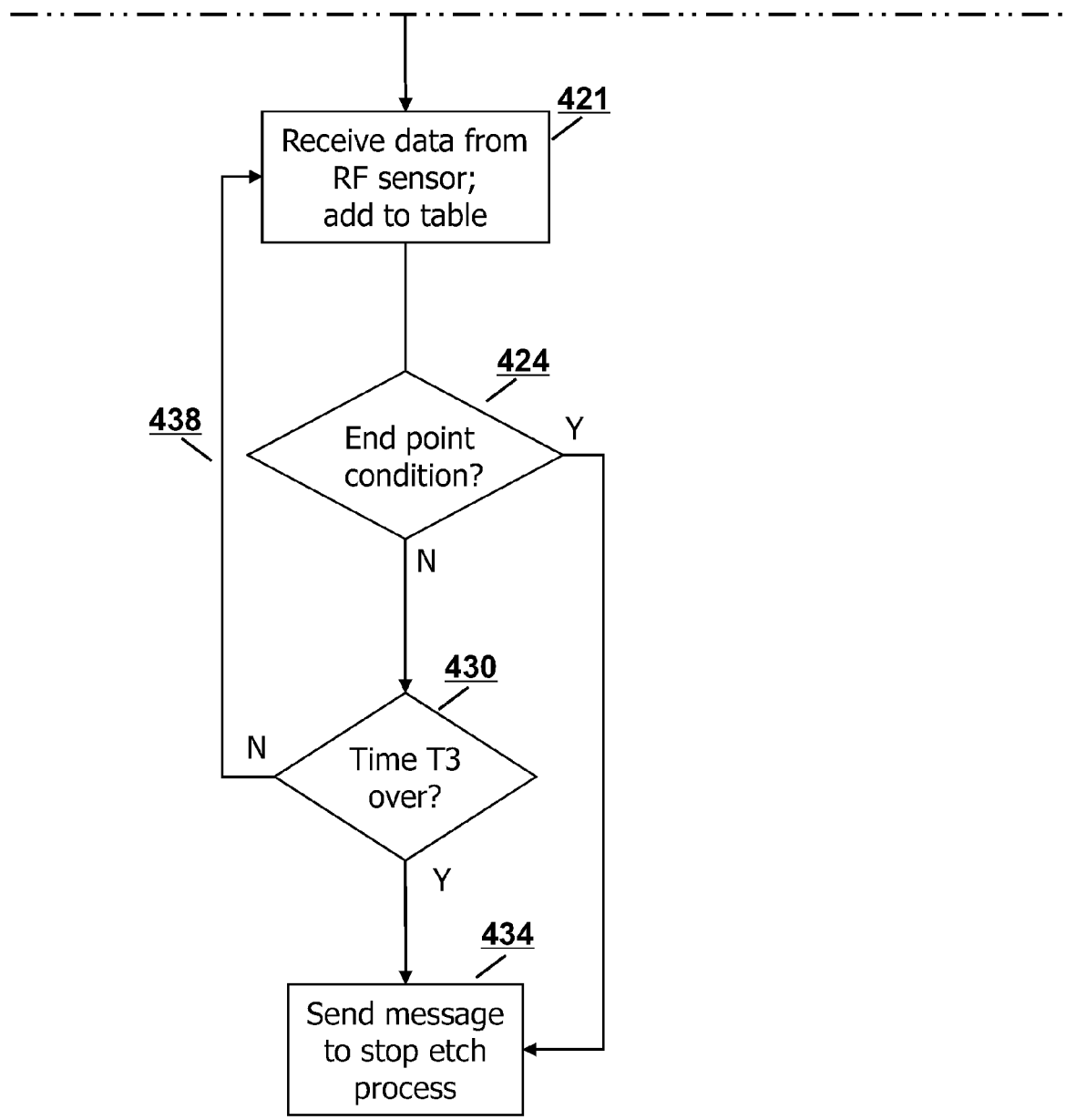

The logic of the present invention is shown in FIG. 4. The behavior of the inventive method is different within various time periods. The time periods are defined as:

Zero to T1: "Settling time", during which data received from RF sensor 103 is ignored because the data may be dominated by transient effects.

T1 to T2: "Fitting period", during which data from RF sensor 103 is collected for the purpose of fitting a curve to the data, thereby forming a mathematical model for the instant wafer.

T2 to T3: "Monitoring time", during which a version of real-time data from RF sensor 103 is compared with the mathematical model to determine if etching should be stopped.

T3: "Time out", the maximum time etching is allowed to continue if an end point command is not issued by the controller 106 beforehand. In some embodiments the settling time is considered to be within the fitting period, using less than all of the fitting period data.

Referring to FIG. 4, at step 400 the plasma etch tool 101 sends a message to cell controller 104 that the etching process has started. Controller 106 also receives this message and begins the settling time, terminating at time T1, during which controller 106 ignores the data being received from RF sensor 103. The elapsed time is compared against T1 at step 402. The logic flow loops back, taking branch 404, until time T1 has elapsed. When elapsed time is greater than T1, branch 406 is taken. Steps 408, 412, and 414 form a loop, operative during the fitting period, during which data is received by controller 106 from RF sensor 103 at step 408, the data stored at step 412, and elapsed time compared to time T2 at step 414. So long as elapsed time is less than T2 the process returns to step 408 from step 414. In some embodiments all of the data sets received from RF sensor 103 are stored at step 412. In other embodiments less than all of the received data sets are stored. During this time (until step 419), data sets are simply stored for later use in building a mathematical model of the etching process.

When the elapsed time exceeds time T2 we calibrate the model for the instant wafer at step 419. The model is a function of time, and may be evaluated for any particular time point during the monitoring period. During the loop comprised of steps 421, 424, 430 and 438, the data that controller 106 continues to receive from RF sensor 103 is evaluated for the purpose of determining when a desired end-point condition exists. At step 421 new data is received from RF sensor 103 and saved to a table in memory. At step 424 the table of newly received data sets (i.e., data sets received after time T2) is operated upon to form a value for the instant time, which is compared to the model as evaluated for the same point in time to determine if etching should be stopped. The difference between the value formed from the data table data for the instant time and the model (as evaluated for the same point in time as that of the newly receive data), is termed the "residual" of the two. The residual is examined by the controller 106 program to see if the residual exceeds a certain predetermined value, which in one embodiment signifies that etching should be stopped. If the end point condition for the etch process has not been reached at step 424 (that is, the residual, or a version of the residual, does not exceed the certain predetermined value), controller 106 compares the elapsed time to time T3 at step 430. If the elapsed time is greater than time T3, controller 106 stops the etching process by sending a message to plasma tool 101 to stop the etch process in chamber 102. If the elapsed time is not greater than time T3 we return to step 421 to repeat the process. If at step 424 the controller 106 program detects the predetermined end point condition the controller 106 branches to step 434 and send a message from controller 106 to plasma tool 101, the message signifying to stop the etching process. In one embodiment T1 is 30 seconds, T2 is 90 seconds, and T3 is 160 seconds, all being total time from the start of etching the wafer, inclusive of the settling time. These time periods vary with equipment design, plasma chemistry, thickness and type of material being etched, and other factors.

RF sensor 103 takes data from chamber 102 and reports voltage, current, and the phase angle between them at regular intervals (step 408). The method according to the present invention uses the data to calculate the instant reactance of chamber 102 by:

$$X = \frac{V}{I}\sin\Phi \quad \text{[EQ 1]}$$

where V is the RMS voltage at the fundamental frequency of RF generator 302, I is the RMS current at the fundamental frequency of RF generator 302, and $\phi$ is the phase angle between them. In another embodiment the reactance value is provided directly by RF sensor 103 to controller 106.

After the settling time, to form the mathematical model, reactance values are calculated during the fitting period and saved for later use. In one embodiment of the method of the invention the reactance calculations from the fitting period are used to determine an exponential curve representing the chamber reactance over time. This curve reflects the characteristics of the specific wafer currently being etched and the instant conditions inside the plasma processing chamber 102. In some embodiments of the present invention a representation of the reactance of plasma processing chamber 102 is received directly from the RF sensor 103.

The chamber reactance X at time $t_i$ is termed "$X(t_i)$". The reactance over the time of the fitting period is then fitted to an exponential curve of the form $$X(t_i) = A + Be^{-\lambda t_i} \quad \text{[EQ 2]}$$

for all $t_i \epsilon T_F$, where A, B, and $\lambda$ are empirically derived constants and $T_F$ is the duration of the fitting period.

To evaluate [EQ 2] first make an estimate of the value of λ, denoted as $\hat{\lambda}$, using reactance values from the beginning, middle and end of the fitting period $T_F$ by solving for $\hat{\lambda}$ in:

$$\frac{e^{-\hat{\lambda}t_E} - e^{-\hat{\lambda}t_B}}{e^{-\hat{\lambda}t_B} - e^{-\hat{\lambda}t_M}} = \frac{X_E - X_B}{X_M - X_B} \quad [EQ\ 3]$$

where "B", "M", and "E" subscripts denote data points at the beginning, middle, and end, respectively, of time period $T_F$ (T1<$T_F$<=T2).

Using these reactance values, solve EQ 3 for $\hat{\lambda}$ using a Newton line search, Taylor series expansion, or other method to solve for the root of a non-linear, real function of one variable.

In one embodiment we assume that the actual best value of λ, denoted as λ*, is within ±15% of $\hat{\lambda}$. We compute a series of linear regressions on the remaining parameters A and B by varying λ in 1% increments about $\hat{\lambda}$, minimizing the total squared error ("TSE") in the values of the parameters A and B from [EQ 2]. For any such value of λ, the linear regression consists of minimizing the TSE defined by:

$$TSE(A, B, \lambda) = \sum_{t_i \in T_F}^{\square} (X(t_i) - (A + Be^{-\lambda t_i}))^2$$

For each value of λ this linear regression yields a certain minimum value for TSE, denoted as TSE*(λ), with the corresponding values for A and B, denoted as A*(λ) and B*(λ), that achieve that certain minimum for TSE. We select the value of λ which has the smallest value of TSE(A*(λ),B*(λ), λ). This best value of λ is denoted as λ*. We then use the corresponding values of A and B as the best values for those two parameters, denoted as A* and B*, where A*=A*(λ*) and B*=B*(λ*). This completes step 419.

Using the values λ*, A*, and B* we can predict the expected plasma processing chamber reactance during the remaining etch time, that is, for the monitored period. For any $t_i$>T2 (in other words, after the end of the fitting time), we compute a "residual" $\epsilon_i$ using:

$$\varepsilon_i = A^* + B^* e^{-\lambda^* t_i} - X(t_i)$$

where X($t_i$) is the observed reactance at time $t_i$.

To decide whether the residual $\epsilon_i$ is significant and indicates the etch endpoint, the method according to the present invention takes into account the level of noise observed in the fitting window by calculating a "noise-compensating factor", which is expressed by:

$$\varepsilon^* = \left(\frac{TSE^*(\lambda^*)}{N}\right)^{\frac{1}{2}}$$

wherein N is the number of data points used in the fitting window period, $T_F$. We can now express the residuals of the observed reactance values (in the monitoring period) in terms of standard deviations away from the extended version of the model (that is, the model evaluated at the time of the latest data point received from RF sensor 103) as:

$$y_i = \frac{\varepsilon_i}{\varepsilon^*}$$

for any time $t_i$ in the monitoring time.

To further compensate for noise in the data a ten-point moving average of $y_i$ is used, calculated by using:

$$\bar{y}_i = \frac{1}{10} \sum_{k=0}^{9} y_{i-k}.$$

Figure 5:
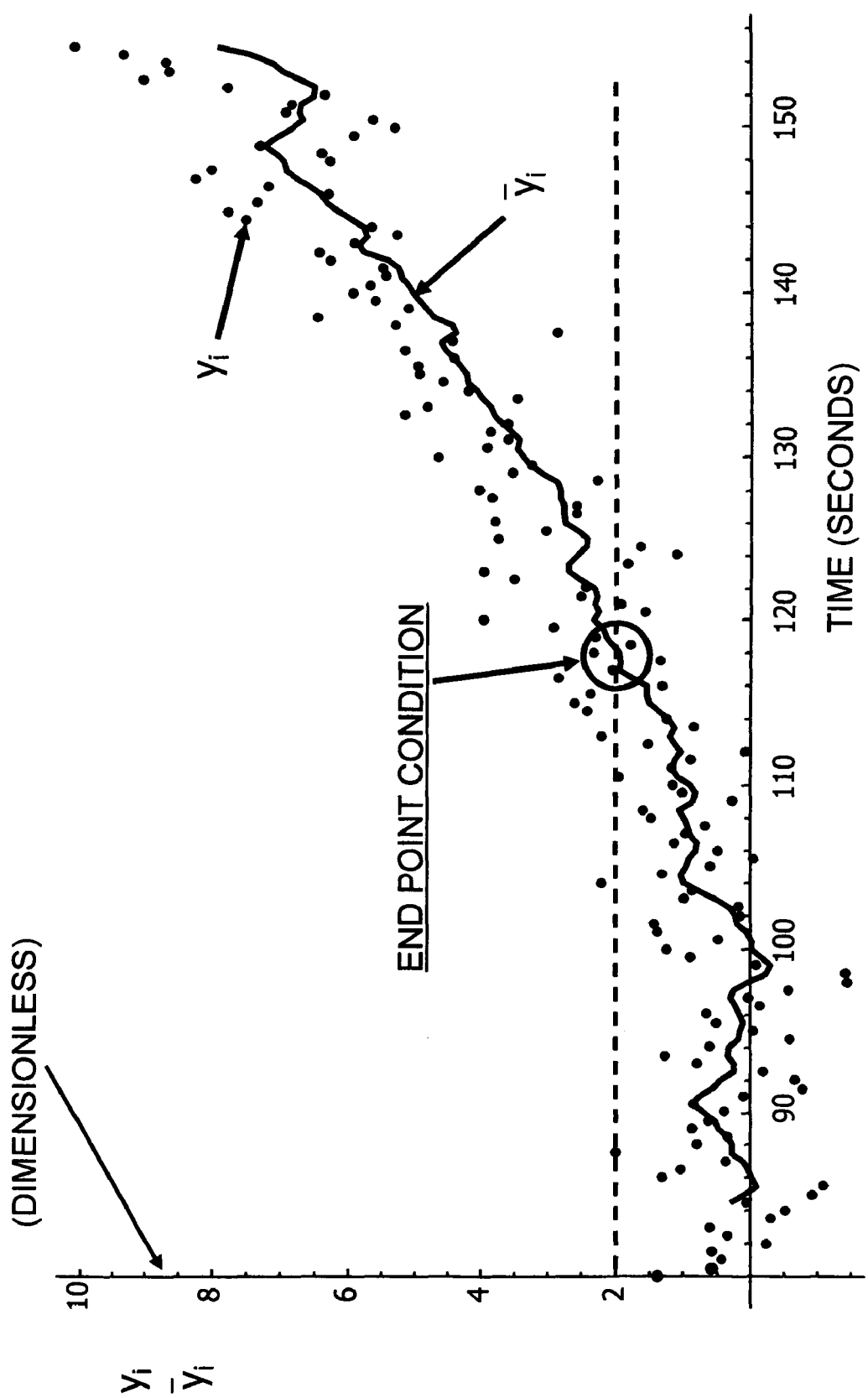
FIG. 5 is an example of a version of collected data point residuals and their moving average in accordance with one embodiment of the present invention.

The controller 106 generates an endpoint notification when |$\bar{y}_i$| exceeds a predetermined maximum, for example greater than 2. FIG. 5 is an example of data which plots $y_i$ (the data points) and $\bar{y}_i$ (the curve of the moving average) against time for a typical wafer.

It will be apparent to one skilled in the art that the specific details presented are not required to practice the invention. For example the teachings of the present invention are readily applicable to an end point detection at |$\bar{y}_i$| other than two. A moving average of other than ten-points may also be used or another mathematical method of dampening rather than moving average. Experience with other plasma etching equipment will determine different values for T1, T2, and T3 to be satisfactory. The teachings of the present invention may be applied to these and other variations which are herein claimed as well as the specifics disclosed above.

We claim:

1. A method for controlling a plasma processing chamber, wherein the plasma processing chamber includes an RF generator, the RF generator providing a drive signal to an electrode to generate a gas plasma, and an RF sensor for sensing operating characteristics of the drive signal, wherein the plasma processing chamber processes a single semiconductor wafer at a time, the method consisting of:
    (1) selecting a mathematical model equation of the form X(ti)=A+Be(exp (−λ*ti)), wherein X(ti) is an instant electrical reactance of the plasma processing chamber;
    (2) commanding the plasma processing chamber to begin processing the wafer according to a predetermined plasma etching recipe;
    (3) receiving a plurality of data sets from the RF sensor, each data set comprising a representation of RMS voltage, RMS current, and phase angle between the RMS voltage and RMS current during a first time period, wherein each data set corresponds to a unique time point;
    (4) saving the data sets received from the RF sensor and their corresponding time points;
    (5) calculating the variable parameters A, B, and λ using the data set values;
    (6) receiving an additional data set from the RF sensor during a second time period;
    (7) saving the additional data set received from the RF sensor and its corresponding time point;
    (8) using the values of the variable parameters A, B, and λ from the first time period, calculating a value of the mathematical model for a time point corresponding to the same time point of the additional data set;

(9) calculating a residual between the additional data set and the value of the mathematical model for the time point corresponding to the time point of the additional data set;

(10) if and the residual is greater than a predetermined threshold, commanding the plasma processing chamber to stop processing; and

(11) if the residual is not greater than the threshold, repeating the process steps beginning with the operation (6) above, thereby extending the second time period.

2. The method according to claim 1, wherein less than all of the data sets received during the first time period are used to calculate the mathematical model.

3. The method according to claim 1, wherein the instant electrical reactance is received from the RF sensor.

4. The method according to claim 1, wherein the instant electrical reactance of the plasma processing chamber is calculated by the formula of Reactance=(V*SIN(Theta)/I), wherein V, I, and Theta respectively represent the RMS voltage, RMS current, and the angle between the RMS voltage and the RMS current, provided to the electrode of the plasma processing chamber by the RF generator.

5. The method according to claim 1, wherein the mathematical model is modified to reduce the effect of noise during the first time period.

6. The method according to claim 1, wherein the predetermined threshold is a number of standard deviations of a difference between the data set and the mathematical model during the second time period.

7. The method according to claim 6, wherein the number of standard deviations is two.

8. The method according to claim 1, wherein the threshold is a sliding multiple-point average of a standard deviation of the difference between the data set and the mathematical model during the second time period.

9. The method according to claim 8, wherein the sliding multiple-point average of the standard deviation is approximately two.

10. The method according to claim 1, further including a step wherein the plasma processing chamber is commanded to stop processing if the total time of processing exceeds a predetermined value.

* * * * *